(12) United States Patent
Magcale et al.

(10) Patent No.: US 11,297,742 B2
(45) Date of Patent: Apr. 5, 2022

(54) THERMAL CONTAINMENT SYSTEM WITH INTEGRATED COOLING UNIT FOR WATERBORNE OR LAND-BASED DATA CENTERS

(71) Applicant: Nautilus Data Technologies, Inc., Pleasanton, CA (US)

(72) Inventors: Arnold Magcale, Danville, CA (US); Byron Putnam Taylor, San Jose, CA (US)

(73) Assignee: Nautilus TRUE, LLC, San Ramon, CA (US)

( * ) Notice: Subject to any disclaimer, the term of this patent is extended or adjusted under 35 U.S.C. 154(b) by 0 days.

(21) Appl. No.: 16/022,030

(22) Filed: Jun. 28, 2018

(65) Prior Publication Data

US 2018/0376624 A1    Dec. 27, 2018

Related U.S. Application Data

(63) Continuation-in-part of application No. 14/589,827, filed on Jan. 5, 2015, now abandoned.

(60) Provisional application No. 61/925,044, filed on Jan. 8, 2014.

(51) Int. Cl.
   *H05K 7/20* (2006.01)
   *F24T 10/30* (2018.01)
   *F28D 20/00* (2006.01)

(52) U.S. Cl.
   CPC .......... *H05K 7/20836* (2013.01); *F24T 10/30* (2018.05); *F28D 20/0052* (2013.01); *H05K 7/2079* (2013.01); *H05K 7/20745* (2013.01); *H05K 7/20781* (2013.01)

(58) Field of Classification Search
   CPC .......... H05K 7/20709; H05K 7/20745; H05K 7/20763
   See application file for complete search history.

(56) References Cited

U.S. PATENT DOCUMENTS

| 7,738,251 | B2 * | 6/2010 | Clidaras | G06F 1/20 165/80.4 |
|---|---|---|---|---|
| 2008/0289795 | A1 * | 11/2008 | Hardin | F24T 10/15 165/45 |
| 2009/0168345 | A1 * | 7/2009 | Martini | F24F 11/0001 361/691 |
| 2010/0165565 | A1 * | 7/2010 | Hellriegal | G06F 1/183 361/679.46 |

(Continued)

*Primary Examiner* — Lionel Nouketcha
(74) *Attorney, Agent, or Firm* — Michael D. Eisenberg

(57) ABSTRACT

The thermal containment system generally includes an enclosure, a vertical enclosure, a cable management system, integrated cooling unit, a plurality of quick connect couples for the cooling unit, a plurality of VFD fans, a plurality of recessed wheels, a plurality of wireless sensors and a quick lock system for securing the thermal containment system. The thermal containment system may be employed to control air flow in the data center, isolating hot air expelled by a plurality of computer systems therein and conditioning the hot air with integrated cooling units that may be connected to a closed loop geothermal cooling system. The wireless sensors may be employed to collect data for a data center infrastructure management (DCIM) system that may monitor and manage elements of the thermal containment system.

10 Claims, 6 Drawing Sheets

(56) References Cited

U.S. PATENT DOCUMENTS

| | | | | |
|---|---|---|---|---|
| 2011/0240281 | A1* | 10/2011 | Avery | G05D 23/1917 |
| | | | | 165/287 |
| 2012/0286514 | A1* | 11/2012 | Graybill | F03B 13/00 |
| | | | | 290/52 |
| 2013/0233532 | A1* | 9/2013 | Imwalle | F28F 27/02 |
| | | | | 165/287 |
| 2017/0293330 | A1* | 10/2017 | Hardin | F03G 7/04 |

* cited by examiner

Side View

Side View

Side View Air Flow

Side View

Front View

Side View Air Flow

THERMAL CONTAINMENT SYSTEM WITH INTEGRATED COOLING UNIT FOR WATERBORNE OR LAND-BASED DATA CENTERS

CROSS REFERENCE TO RELATED APPLICATIONS

This application claims reference to Provisional Patent application No. 61/925,044 on Jan. 8, 2014, and a Non-Provisional patent application Ser. No. 14/589,827 filed on Jan. 5, 2015, entitled "A THERMAL CONTAINMENT SYSTEM WITH INTEGRATED COOLING UNIT FOR WATERBORNE OR LAND-BASED DATA CENTERS".

BACKGROUND

Problem Solved:

A data center is a facility designed to house, maintain, and power a plurality of computer systems. The computer systems within the data center are generally rack-mounted where a number of electronics units are stacked within a support frame. The data center is designed to maintain interior ambient conditions suitable for proper operation of the computer systems therein.

In general racks are deployed in parallel rows in a hot aisle, cold aisle arrangement. Racks are installed in rows with the rack-mounted computer systems drawing in cool air from the cold aisle and the heat generated by the rack-mounted computer systems expelled out of the back of the racks into the hot aisles. In this configuration, cold and hot air are free to move and mix throughout the data center. This mixing of hot and cold air degrades the efficiency of the data center cooling system resulting in higher amounts of power consumed to cool the data center and the plurality of computer systems therein.

Present day data centers employ inefficient computer room air conditioner (CRAC) units to maintain the ambient temperature. Data center providers struggle to manage or optimize airflow, resulting with the known issue of hot and cold air mixing throughout the data center. These inefficiencies prohibit the support of high-density computer systems in present day data centers where corresponding high-density power supply can potentially be outstripped by the data center cooling demands. The described thermal containment system may be implemented to control and optimize airflow in the data center by isolating heat expelled in the hot aisle. The thermal containment system may isolate the heat exhausted from the computing systems in the hot aisles preventing mixing of hot and cold air in the data center.

Present day data centers employ inefficient computer room air conditioner (CRAC) units to maintain the ambient temperature. Data center providers struggle to manage or optimize airflow, resulting with the known issue of hot and cold air mixing throughout the data center. These inefficiencies prohibit the support of high-density computer systems in present day data centers where corresponding high-density power supply can potentially be outstripped by the data center cooling demands. The described thermal containment system may be implemented to control and optimize airflow in the data center by isolating heat expelled in the hot aisle. The thermal containment system may isolate the heat exhausted from the computing systems in the hot aisles preventing mixing of hot and cold air in the data center.

Present day data centers employ inefficient computer room air conditioner (CRAC) units to maintain the ambient temperature. Data center providers struggle to manage or optimize airflow, resulting with the known issue of hot and cold air mixing throughout the data center. These inefficiencies prohibit the support of high-density computer systems in present day data centers where corresponding high-density power supply can potentially be outstripped by the data center cooling demands. The described thermal containment system may be implemented to control and optimize airflow in the data center by isolating heat expelled in the hot aisle. The thermal containment system may isolate the heat exhausted from the computing systems in the hot aisles preventing mixing of hot and cold air in the data center.

In addition, the hot air may be conditioned by an integrated cooling unit in the thermal containment system. The isolation of hot air along with conditioning close to the heat source greatly increases the data center cooling system efficiency.

SUMMARY

A re-configurable thermal containment system, wherein the said system is caused to, in an enclosure comprising a plurality of heat generating sources, circulate cool air drawn from a cooling unit, control circulation of the cool air through the heat generating sources, isolate heated air exhausted from the heat generating sources, cool, via the cooling unit, the isolated air exhausted from the heat generating sources; and re-circulate the cooled air through the heat generating sources.

In a re-configurable thermal containment system comprising an enclosure which houses a plurality of heat generating sources, a method comprising, circulating cool air drawn from a cooling unit through the plurality of heat generating sources, controlling the circulation of the cool air through the heat generating sources, isolating heated air exhausted from the heat generating sources, cooling, via the cooling unit, the isolated air exhausted from the heat generating sources, and re-circulating the cooled air through the heat generating sources.

DETAILED DESCRIPTION

Figure 1:
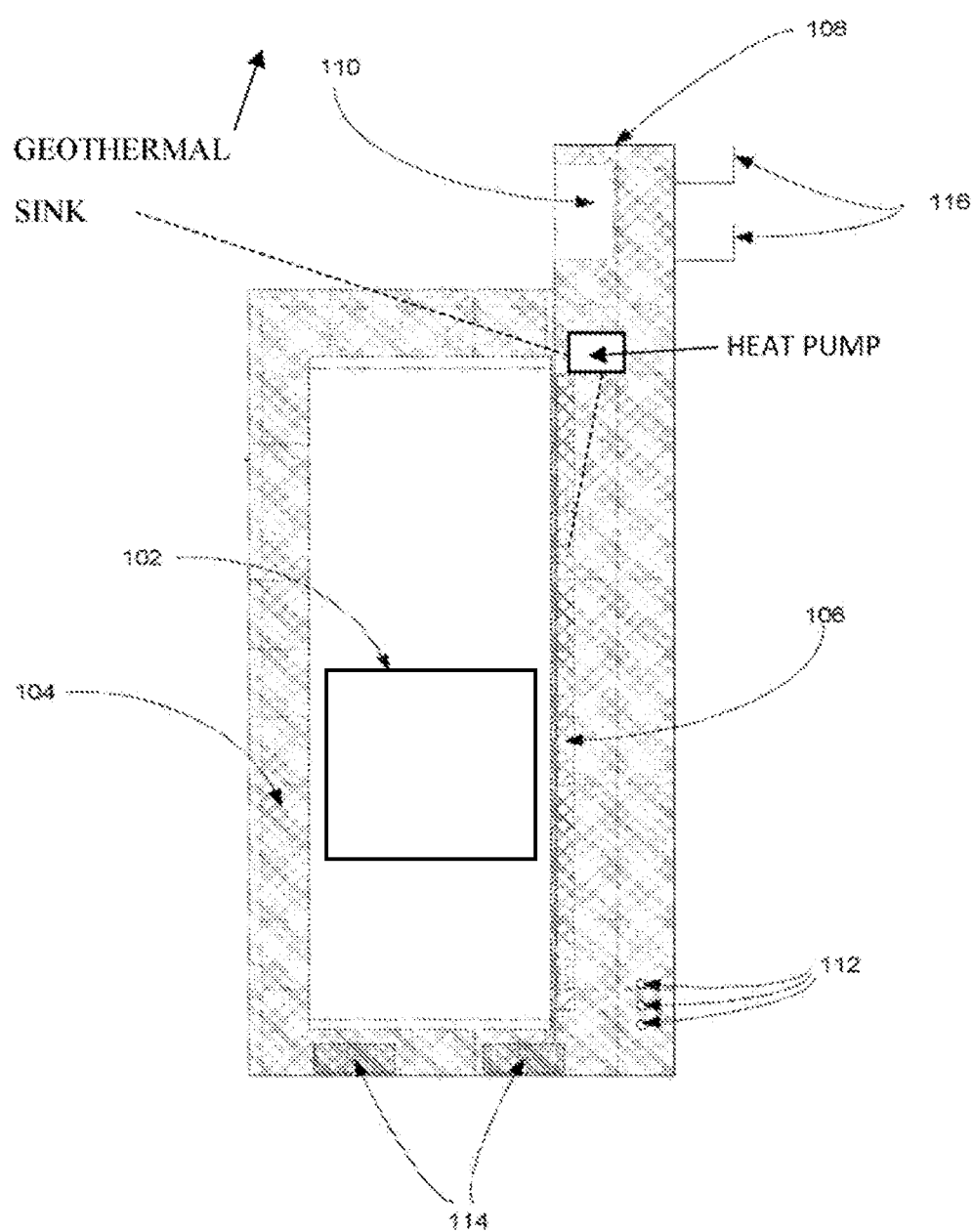
FIG. 1 illustrates the side view of a thermal containment system with rear mounted cooling unit.

As stated above, a data center is a facility designed to house, maintain, and power a plurality of computer systems. The computer systems within the data center are generally rack-mounted where a number of electronics units are stacked within a support frame. The data center is designed to maintain interior ambient conditions suitable for proper operation of the computer systems therein.

In general racks are deployed in parallel rows in a hot aisle, cold aisle arrangement. Racks are installed in rows with the rack-mounted computer systems drawing in cool air from the cold aisle and the heat generated by the rack-mounted computer systems expelled out of the back of the racks into the hot aisles. In this configuration, cold and hot air are free to move and mix throughout the data center. This mixing of hot and cold air degrades the efficiency of the data center cooling system resulting in higher amounts of power consumed to cool the data center and the plurality of computer systems therein. Embodiments disclosed here solve this problem.

According to an embodiment, control and optimization of airflow in the data center can be achieved by containing the hot air in the hot aisle. The described systems and methods may be implemented to control and optimize airflow in the data center by containing the heat exhausted from the plurality of computing systems in the hot aisles for conditioning by an integrated cooling unit. In addition, the system and methods provide an integrated solution for hot air containment, cable management, controlled airflow and a close to source integrated cooling unit.

Embodiments disclose new, improved, highly efficient thermal containment systems and methods. The thermal containment system described is designed to be a component of a data center architecture where all components are integrated and designed for optimal efficiency. The systems and methods may be implemented to control and optimize airflow in the data center by containing the heat exhausted from the plurality of computing systems in the hot aisles for conditioning by a cooling unit. In addition, the system and method provide an integrated solution for hot air containment, cable management, controlled airflow and cooling.

Embodiments disclose an improved thermal containment system and method, designed to be comprised in a data center architecture where all components are integrated and designed for maximum efficiency. The systems and methods may be implemented to control and optimize airflow in the data center by containing the heat exhausted from the plurality of computing systems in the hot aisles for conditioning by a cooling unit. In addition, the system and method provide an integrated solution for hot air containment, cable management, controlled airflow and cooling.

Present day data centers are designed with an open floor plan, with rows of computer systems arranged in a hot aisle and cold aisle configuration. This allows hot and cold air to freely mix throughout the data center, decreasing efficiency of the cooling systems. Computer Room Air-Conditioning (CRAC) units are typically installed along the interior walls of the data center some distance from the heat source, again decreasing the efficiency of the cooling systems.

The embodiments disclosed describe a thermal containment system, implemented to control and optimize airflow in the data center by isolating heat expelled in the hot aisle. The thermal containment system may isolate the heat exhausted from the computing systems in the hot aisles preventing mixing of hot and cold air in the data center.

Figure 2:
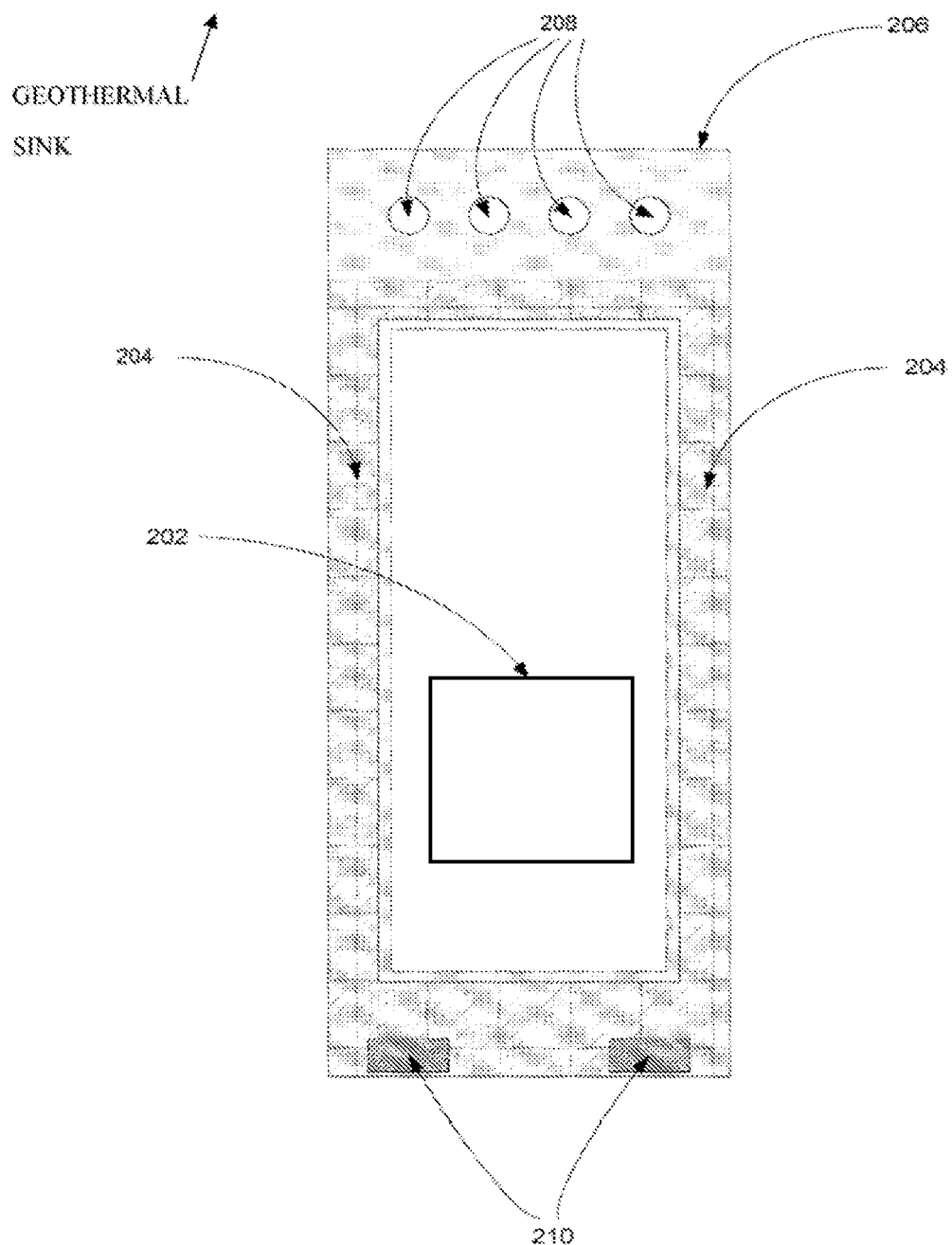
FIG. 2 illustrates the front view of a thermal containment system with rear mounted cooling unit.

Additionally, the hot air may be conditioned by an integrated cooling unit in the thermal containment system. The isolation of hot air along with conditioning close to the heat source greatly increases the data center cooling system efficiency. FIG. 1 illustrates the side view of a thermal containment system with rear mounted cooling unit. The illustrated embodiment includes an enclosure 100, rack-mounted computer systems 102, vertical cable management tray 104, closed-loop cooling unit 106, and vertical enclosure 108; variably frequency drive (VFD) fans 110, quick connect hydraulic couplings 112, cutouts 114, and cable ladders 116. FIG. 2 illustrates the front view of a thermal containment system with rear mounted cooling unit. The illustrated embodiment includes an enclosure 200, rack-mounted computer systems 202, cable management 204, vertical enclosure 206, variably frequency drive (VFD) fans 208, and cutouts 210.

Figure 3:
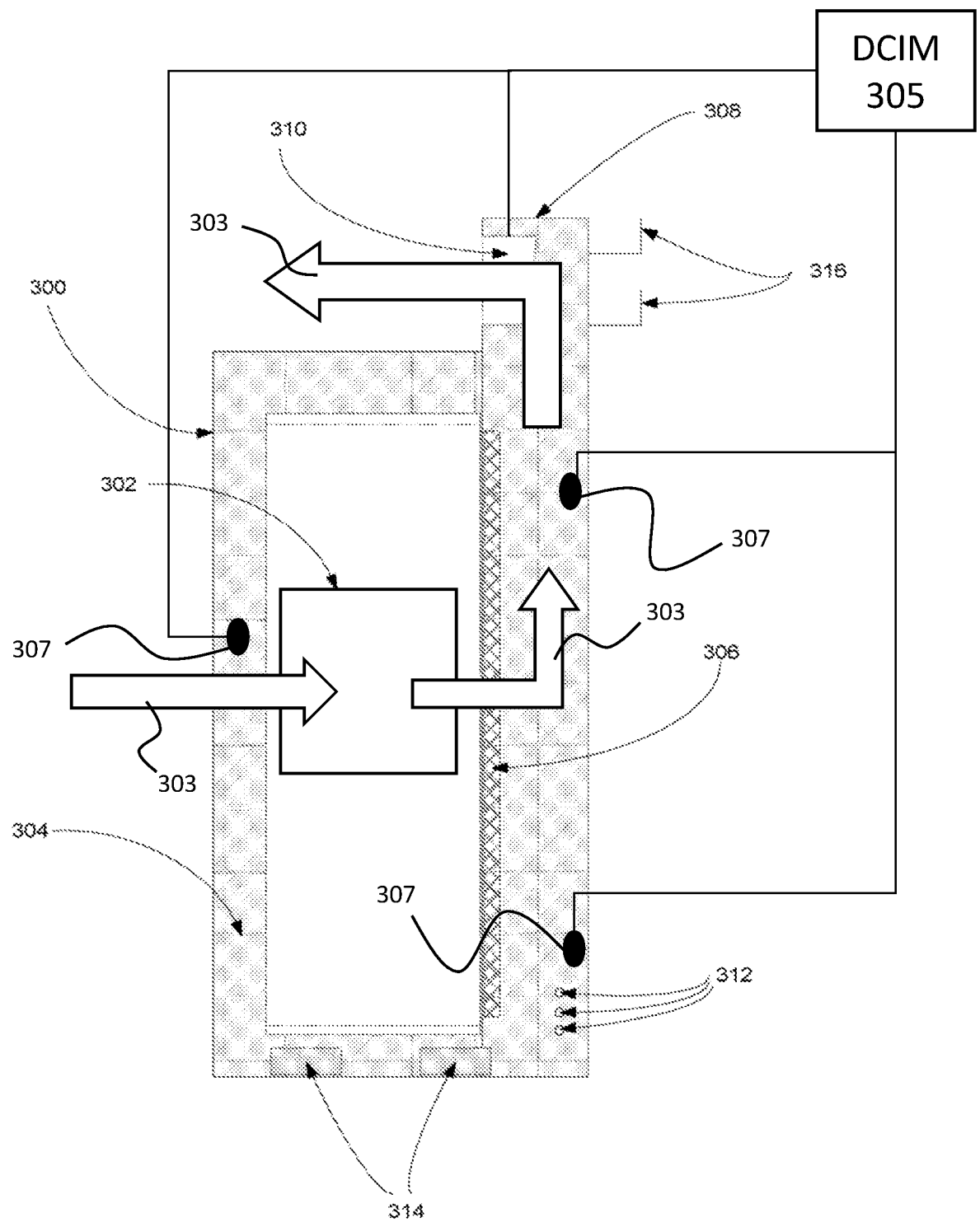
FIG. 3 is a side view illustrating the air flow in an embodiment.

FIG. 3 is a side view illustrating the air flow 303 in an embodiment. The illustrated embodiment includes enclosure 300, rack mounted computer systems, 302, vertical cable management tray 304, closed loop cooling unit 306, vertical enclosure 308, variably frequency drive (VFD) fans 310, quick connect cables 312, cutouts 314, and cable ladders 316.

Figure 4:
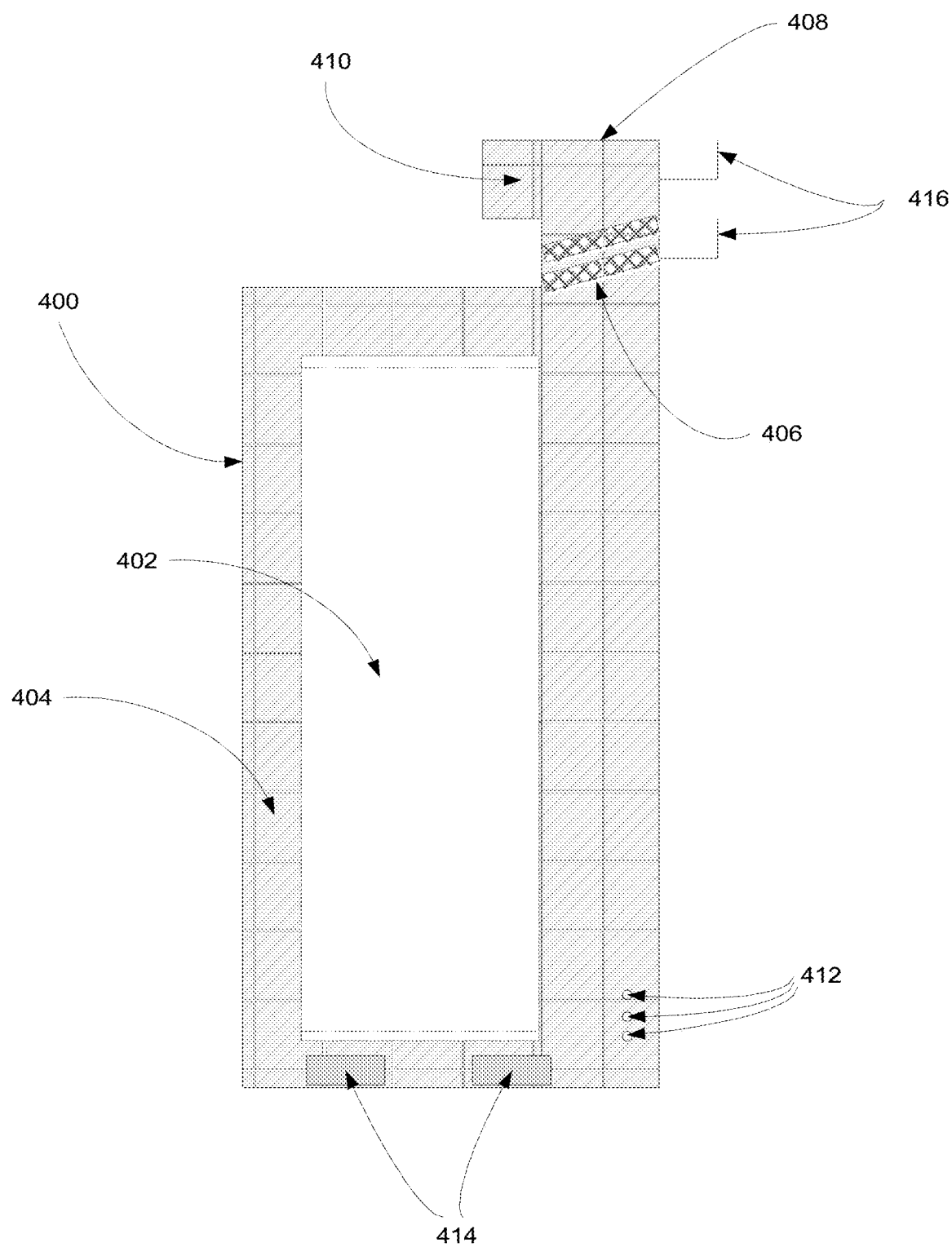
FIG. 4 is a front view illustrating an embodiment of a thermal containment system with top mounted cooling unit.

FIG. 4 is a front view illustrating an embodiment of a thermal containment system with top mounted cooling unit. The illustrated embodiment includes enclosure 400, rack-mounted computer systems 402, vertical cable management tray 404, closed-loop cooling unit 406, vertical enclosure 408, variably frequency drive (VFD) fans 410, quick connect hydraulic couplings 412, cutouts 414, and cable ladders 416.

Figure 5:
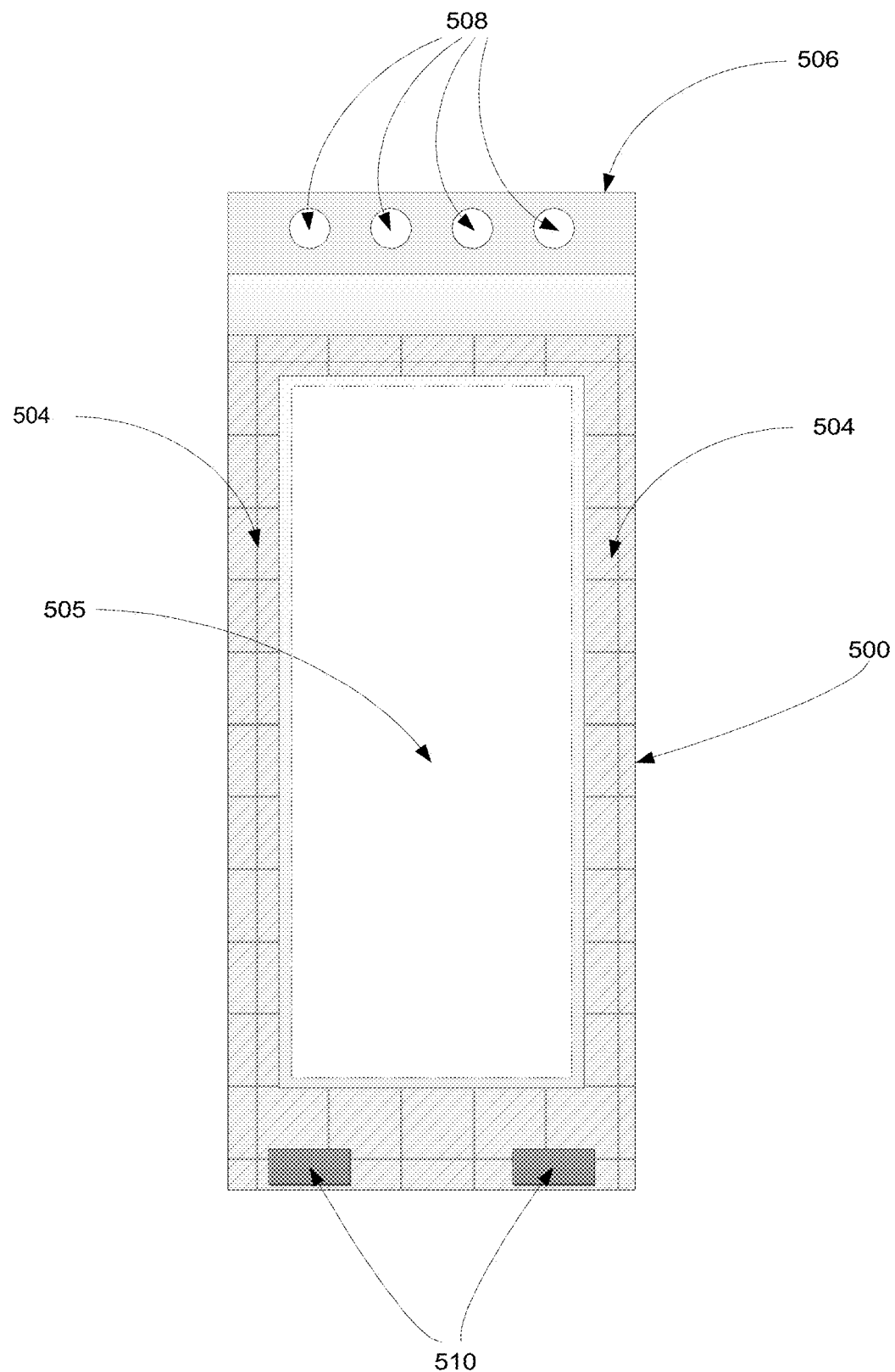
FIG. 5 is a front view illustrating a thermal containment system with rear mounted cooling unit.

FIG. 5 is a front view illustrating a thermal containment system with rear mounted cooling unit. The illustrated embodiment includes enclosure 500, rack-mounted computer systems 502, cable management 504, vertical enclosure 506, variably frequency drive (VFD) fans 508, and cutouts 510.

Figure 6:
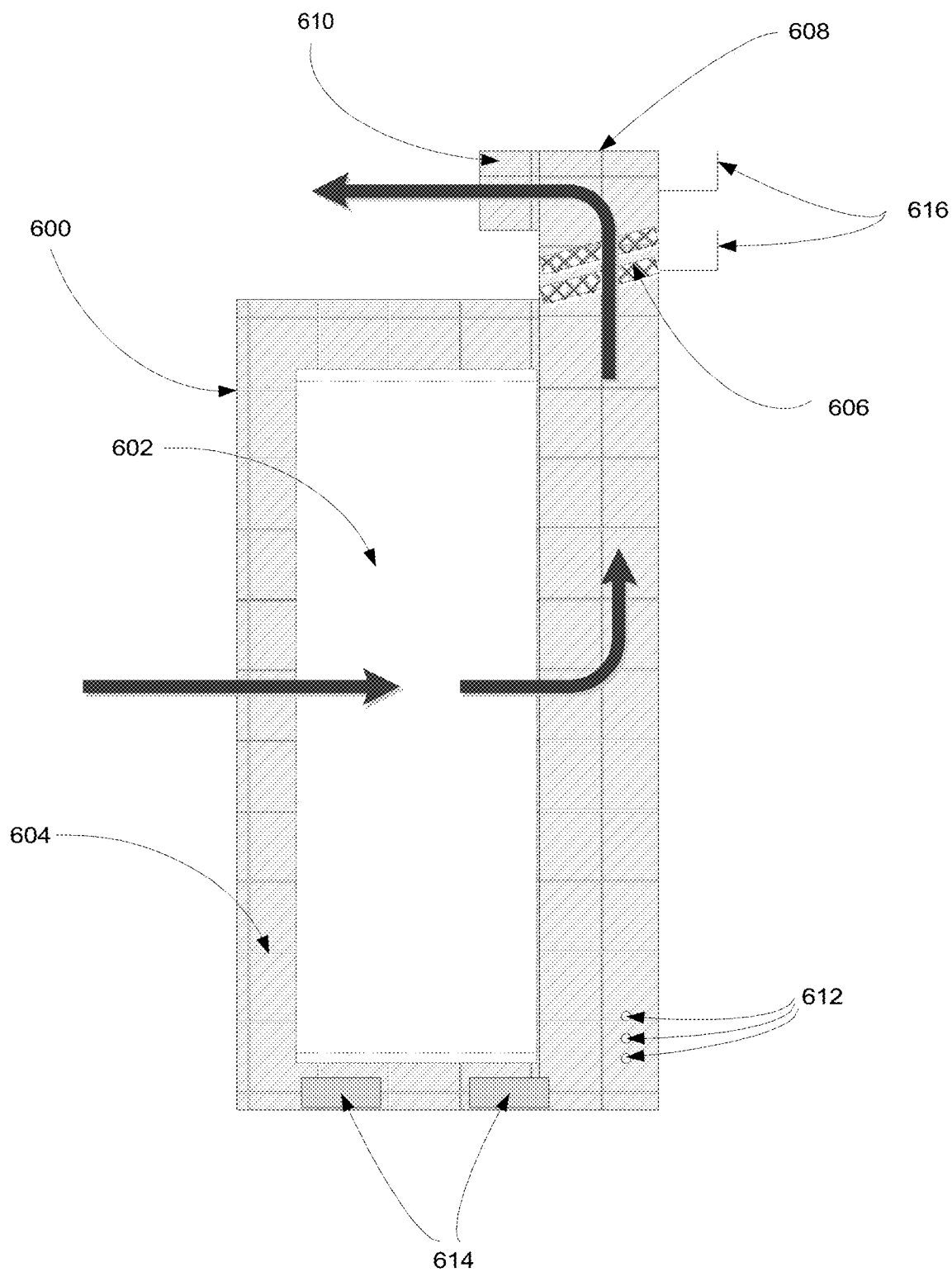
FIG. 6 shows a side view of the thermal containment system with airflow.

FIG. 6 is a side view illustrating air flow in an embodiment. The illustrated embodiment includes enclosure 600, rack-mounted computer systems 602, vertical cable management tray 604, closed-loop cooling unit 606, vertical enclosure 608, variably frequency drive (VFD) fans 610, quick connect hydraulic couplings 612, cutouts 614, and cable ladders 616.

In preferred embodiments, rack-mounted computer systems are completely enclosed in the enclosure, wherein rack-mountable equipment and corresponding racks enable easy installation and de-installation, and capacity addition and reduction, as the requirement may be. The vertical enclosure is a chimney type enclosure that extends beyond the rack height. Quick connect couplings comprised in the closed loop cooling unit serve to connect inlet and outlet water supplies for seamless circulation. Sensors disclosed above comprise means for collecting data on air temperature, humidity, water flow, water temperature, and any other infrastructure, environmental, and component parameter essential for optimal thermal containment. Variable Frequency Drive (VFD) fans contribute to enhanced efficiency, in that data collected from the plurality of sensors is analyzed and processed by a data center infrastructure management (DCIM) system, which accordingly controls fan speed for optimal performance and energy efficiency. An optional embodiment also comprises a single or plurality of Variable Frequency Drive (VFD) pumps which are similarly controlled by the DCIM to control the flow of water through the closed loop cooling unit. Vertical cable management trays comprise vertical channels used to manage cable runs from the computer equipment that is installed in the rack. Ethernet cables or power cables can use this. This keeps the airway paths in the front and back of the rack clear in order to maximize efficiency.

Additional embodiments comprise recessed wheels comprising quick lock mechanisms for securing the thermal containment system and rack mounting to a data center floor surface. The wheels make for easy transport to the install location and comprise quick lock mechanisms for securing the rack in place.

Preferred embodiments include all of the elements above. The enclosure controls the flow of air entering and exiting the rack. The vertical enclosure extension is used to direct the flow of air exiting the rear of the rack. The quick connects, cable management and wheels with quick locks add to the ease of setup and efficiency of the rack.

Relationship Between the Components:

Alternate embodiments of the thermal containment system are shown in FIG. 4 (side view), FIG. 5 (front view) and FIG. 6 (side airflow view).

FIG. 1 shows a side view of the thermal containment system comprising an enclosure 100, a computer systems rack 102, a vertical cable management tray 104, a vertical enclosure 108, cabling ladders 116, a plurality of variable frequency drive (VFD) fans 110, a plurality of quick connect couplings 112 that are connected to the closed-loop cooling unit 106 and cutouts 114 that may be used for pallet jacks or recessed wheels.

FIG. 2 shows a front view of the thermal containment system comprising an enclosure 200, a computer systems rack 202, a vertical enclosure 206, a plurality of variable frequency drive (VFD) fans 208, cable management trays 204 and cutouts 210 that may be used for pallet jacks or recessed wheels. FIG. 3 shows a side view of the thermal containment system with airflow comprising a rack for computer systems 302 where rack mounted computer systems draw cool air into the enclosure 300, then the heated exhaust air passes through the closed-loop cooling unit 306 where the heat is absorbed. The VFD fans 310 draw the cooled air through the vertical stack enclosure 308 where it is passed through to the cold aisle.

FIG. 4 shows a side view of the thermal containment system comprising an enclosure 400, a computer systems rack 402, a vertical cable management tray 404, a vertical enclosure 408, cabling ladders 416, a plurality of variable frequency drive (VFD) fans 410, a plurality of quick connect couplings 412 that are connected to the closed-loop cooling unit 406 and cutouts 414 that may be used for pallet jacks or recessed wheels.

FIG. 5 shows a front view of the thermal containment system comprising an enclosure 500, a computer systems rack 502, a vertical enclosure 506, a plurality of variable frequency drive (VFD) fans 508, cable management trays 504 and cutouts 510 that may be used for pallet jacks or recessed wheels.

FIG. 6 shows a side view of the thermal containment system with airflow comprising a rack for computer systems 602 where rack-mounted computer systems draw cool air into the enclosure 600, then the heated exhaust air is drawn up vertical stack enclosure 608 and passes through the closed-loop cooling unit where the heat is absorbed. The VFD fans 610 then exhaust the cooled air to into the cold aisle.

According to an embodiment, the cooling apparatus comprises a first heat exchanger in thermal communication with a plurality of computing devices and includes a heat absorbing fluid caused to absorb heat from the plurality of computing devices. The cooling apparatus further comprises a second heat exchanger operatively coupled to the first heat exchanger and a single or plurality of coolant intake pipes and coolant exhaust pipes in a geothermal field structured to exchange heat from the heat absorbing fluid with a geological heat sink. Preferably, a heat pump is operatively coupled to the coolant intake and coolant exhaust pipes in a closed loop coolant circuit and is configured to transport heat absorbed by the second heat exchanger from the first heat exchanger to the geological heat sink.

According to an embodiment, the cooling apparatus further comprises a heat dissipater operatively coupled to the second heat exchanger and the geological heat sink via the single or plurality of coolant intake and exhaust pipes and is structured or configured to receive the heat exchanged from the heat absorbing fluid.

In one embodiment, the cooling apparatus further comprises a chiller disposed downstream of the first heat exchanger, wherein the chiller is structured to selectively receive a portion of heat absorbing fluid. And the plurality of computing devices further comprises a plurality of processors, wherein each of the plurality of processors further comprises a heat sink, wherein the heat sink is placed in direct communication with the heat absorbing fluid.

According to a preferred embodiment, the cooling apparatus further comprises a third heat exchanger structured to transfer heat from the heat absorbing fluid, absorbed from the first heat exchanger, to a second heat absorbing fluid which passes through the second heat exchanger, wherein the first heat exchanger and the second heat exchanger define a dual loop indirect heat exchanger.

In a preferred embodiment, the cooling apparatus further comprises a heat dissipater disposed in parallel with respect to the chiller, wherein one or more valves are located downstream of the first heat exchanger to selectively flow at least a portion of heat absorbing fluid through at least one of the chiller and the heat dissipater. Additionally, a fluid bypass is disposed parallel to the chiller and the heat dissipater.

According to an embodiment, heat from the geological heat sink is transferred to the heat absorbing fluid, wherein this heat is dissipated by at least one of the chiller and the heat dissipater.

According to an embodiment of the cooling apparatus, the geothermal heat sink can be comprised in an ocean or sea, a river, a lake, a reservoir, a glacier, an aquifer, reclaimed water, non-potable water, a mountain spring, a still or flowing ground water source, a dry underground source with temperature differentials significant from the earth's surface, and underground piping.

According to an embodiment of the cooling apparatus, the closed-loop is at least one of a vertical closed loop, a horizontal closed loop, a slinky loop and a pond loop.

Embodiments disclosed include a water-based geothermal closed-loop cooling system comprising a single or plurality of water intake pipes and corresponding water exhaust pipes in a geothermal field and comprised in a first heat exchanger. The closed-loop cooling system further comprises a single or plurality of water pumps and a second single or plurality of heat exchangers operatively coupled to the first heat exchanger and comprising a single or plurality of coolant heat exchange pipes. Preferably, the cooling system includes a closed-loop coolant distribution unit configured to distribute coolant to the second single or plurality of heat exchangers, wherein the single or plurality of water pumps are caused to pump water in through the water intake pipes and out through the water exhaust pipes.

Embodiments disclosed include, in a geothermal water-based closed-loop cooling system, a method comprising, circulating through a first heat exchanger in thermal communication with a plurality of computing devices, a heat absorbing fluid for absorbing heat from the plurality of computing devices. The embodiment includes transferring the absorbed heat to a second heat exchanger operatively coupled to the first heat exchanger comprising a single or plurality of coolant intake pipes and coolant exhaust pipes in a geothermal field and structured to transport heat from the heat absorbing fluid to a geological heat sink. And also transporting the heat to the geological heat sink via a heat pump operatively coupled to the single or plurality of coolant intake pipes and coolant exhaust pipes in a closed loop coolant circuit.

According to an embodiment, the method further comprises receiving the heat exchanged from the heat absorbing fluid by a heat dissipater operatively coupled to the second heat exchanger and the geological heat sink via the single or plurality of coolant intake and exhaust pipes.

In an alternate embodiment, the method of claim comprises selectively receiving a portion of heat absorbing fluid by a chiller disposed downstream of the first heat exchanger.

Preferably, the plurality of computing devices further comprises a plurality of processors, wherein each of the plurality of processors further comprise a heat sink, and wherein the heat sink is placed in direct communication with the heat absorbing fluid.

According to a preferred embodiment, the method further comprises transferring heat from the heat absorbing fluid, absorbed from the first heat exchanger, to a second heat absorbing fluid which passes through the second heat exchanger, by a third heat exchanger, wherein the first heat exchanger and the second heat exchanger define a dual loop indirect heat exchanger.

The method preferably, further comprises selectively causing flowing of at least a portion of heat absorbing fluid through a heat dissipater disposed in parallel with respect to a chiller, wherein one or more valves are located downstream of the first heat exchanger to selectively flow at least a portion of heat absorbing fluid through at least one of the chiller and the heat dissipater. Preferably, a fluid bypass disposed parallel the chiller and the heat dissipater.

According to an embodiment, the method comprises transferring heat from the geological heat sink to the heat absorbing fluid, wherein this heat is dissipated by at least one of the chiller and the heat dissipater.

According to an embodiment in the method, the closed-loop is at least one of a vertical closed loop, a horizontal closed loop, a slinky loop and a pond loop.

Geothermal Heating and Cooling Systems

In a geothermal heating and cooling system, the heat pump is connected to the data center by a distribution system—most commonly air ducts, or/and liquid conduction cooling systems. And the heat pump is connected to the earth through a series of pipes called a "loop". The system exchanges heat with the earth, meaning that no noisy or unsightly outdoor unit is needed.

Vapor Compression Cycle

Most heat pumps use a vapor compression cycle to transport heat from one location to another. In heating mode, the cycle starts as the cold liquid refrigerant within the heat pump passes through a heat exchanger (evaporator) and absorbs heat from the low-temperature source (fluid circulated through the earth connection). The refrigerant evaporates into a gas as heat is absorbed. The gaseous refrigerant then passes through a compressor where it is pressurized, raising its temperature to over 180 degrees F. The hot gas then circulates through a refrigerant-to-air heat exchanger where the heat is removed and sent through the air ducts. When the refrigerant loses the heat, it changes back to a liquid. The liquid refrigerant cools as it passes through an expansion valve, and the process begins again.

Although heat pumps are complex internally, they are of compact design and extremely reliable. Some include features such as additional heat exchangers for water heating, and microprocessor-based automatic controls and protection devices.

Anatomy of a Geothermal Heat Pump

Instead of producing heat like a conventional furnace, a geothermal system moves heat from one place to another. The example below illustrates the cooling process:

The cool, liquid refrigerant enters the indoor coil during cooling. As it enters the coil, the temperature of the refrigerant is between 40 and 50 degrees. As warm, moist room air passes over the cool coil, the refrigerant inside absorbs the heat. The new cooler, drier air is circulated back into the room with a blower fan.

According to an embodiment a first heat exchanger is in thermal communication with a plurality of computing devices and comprising a heat absorbing fluid caused to absorb heat from the plurality of computing devices. A second heat exchanger is coupled to the first heat exchanger and comprises the indoor coil through which the cool, liquid refrigerant flows.

The refrigerant moves into the compressor, which is a pump that raises the pressure, so it will move through the system. The increased pressure from the compressor causes the refrigerant to heat to roughly 120 to 140 degrees.

The hot vapor now moves into the condenser (the underground loops), where the refrigerant gives up its heat to the cooler ground and condenses back into a liquid. As the refrigerant leaves the compressor, it's still under high pressure. It reaches the expansion valve, where the pressure is reduced. The cycle is complete as the cool, liquid refrigerant re-enters the evaporator to pick up room heat.

How the Invention Works:

The described thermal containment system methods and systems may be implemented to control and optimize airflow in the data center by isolating the heated air exhausted from the computing systems in the hot aisles and conditioning the hot air with a cooling unit that is close to the heat source.

In one embodiment the enclosure 300 controls the airflow by isolating the hot air exhausted by the rack-mounted computer systems 302, the hot exhaust air is immediately passed through a closed-loop cooling unit 306 where the heat is absorbed. A plurality of VFD fans 310 then draws the air cooled by the closed-loop cooling unit 306 up through the vertical enclosure 308 where it passes through to mix with the data center ambient air. The systems and methods described may include sensors 307 installed in the thermal containment system. Sensor data may be collected by a data center infrastructure management (DCIM) system 305. The DCIM system 305 may control VFD fans 310 to improve energy-efficiency.

How to Make the Invention:

Design and construct thermal containment system, comprised of a metal enclosure, a vertical closure extension, a closed-loop cooling unit, quick connect couplings for the closed-loop cooling unit, sensors, VFD fans, vertical cable management trays, and recessed wheels comprising quick lock mechanisms for securing the thermal containment system and rack to the data center floor.

All of the elements above are comprised in preferred embodiments. In another embodiment the thermal containment system will comprise an enclosure that will enclose two parallel rows of server racks configured back-to-back so that the heat exhausted from both rows of racks is captured by the same containment enclosure.

In another embodiment the thermal containment system will include a closed-loop cooling unit installed at the back of the thermal containment system.

In yet another embodiment the thermal containment system will include a closed-loop cooling unit installed at the top of the thermal containment system. (FIG. 4, FIG. 5 and FIG. 6).

How to Use the Invention:

To use this invention, one would employ the complete thermal containment system in the data center, install a closed-loop cooling system and distribution piping system that will be connected to the closed-loop cooling units in the thermal containment systems, install and configure the DCIM system and install the sensors that will be used with the DCIM system. Additionally: The described embodiment may be used in waterborne data centers or land-based data centers.

Since various possible embodiments might be made of the above invention, and since various changes might be made in the embodiments above set forth, it is to be understood that all matter herein described or shown in the accompanying drawings is to be interpreted as illustrative and not to be considered in a limiting sense. Thus, it will be understood by those skilled in the art of water borne vessels, and computer data centers and that although the preferred and alternate embodiments have been shown and described in accordance with the patent Statutes, the invention is not limited thereto or thereby. The figures illustrate the architecture, functionality, and operation of possible implementations of systems, methods and computer program products according to various embodiments of the present invention. It should also be noted that, in some alternative implementations, the functions noted/illustrated may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising when used in the specification, specify the presence of stated features, integers, steps, operations, elements, and/or components, but do not preclude the presence or addition of one or more other features, integers, steps, operations, elements, components, and/or groups thereof.

Some portions of embodiments disclosed are implemented as a program product for use with an embedded processor. The program(s) of the program product defines functions of the embodiments (including the methods described herein) and can be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive, solid state disk drive, etc.); and (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-accessible format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

The present invention and some of its advantages have been described in detail for some embodiments. It should be understood that although the system and process is described with reference to a thermal containment system with integrated cooling unit for waterborne or land-based data centers, the system and process may be used in other contexts as well. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, and composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

We claim:

1. A re-configurable thermal containment system, wherein the said system is caused to:
   in an enclosure comprising a plurality of computer systems, circulate cool air;
   via a plurality of variable frequency drive (VFD) fans, variably cause circulation of the cool air through the plurality of computer systems, which variable circulation is based on heat generated in the plurality of computer systems;
   isolate heated air exhausted from the plurality of computer systems; variably cause circulation of the isolated heated air exhausted from the plurality of computer systems through a closed loop cooling unit;
   via a plurality of variable frequency drive (VFD) pumps, variably cause circulation of a heat absorbing fluid through the closed loop cooling unit;
   re-circulate the cooled air through the plurality of computer systems; and
   via a data center infrastructure management system (DCIM), control the VFD fans and pumps for optimal thermal containment based on air temperature, humidity, water flow, water temperature, infrastructure, environmental, and component parameters received by the DCIM from a plurality of connected sensors.

2. The reconfigurable thermal containment system of claim 1 further comprising a chiller disposed downstream of the closed loop cooling unit, wherein the chiller is structured to selectively receive a portion of the heat absorbing fluid.

3. The reconfigurable thermal containment system of claim 1, wherein the plurality of computing systems comprise a plurality of processors, wherein each of the plurality of processors further comprise a heat sink, and wherein the heat sink is structured to be in thermal communication with the heat absorbing fluid.

4. The reconfigurable thermal containment system of claim 1, further comprising:
a first heat exchanger structured to transfer heat from the heat absorbing fluid, absorbed from the plurality of computer systems, to a second heat absorbing fluid which passes through a second heat exchanger, wherein the first heat exchanger and the second heat exchanger define a dual loop indirect heat exchanger.

5. The reconfigurable thermal containment system of claim 1 further comprising:
a vertical enclosure operatively connected to the closed loop coolant circuit, wherein the vertical enclosure is a chimney comprising the plurality of variable frequency drive fans, wherein the plurality of variable frequency drive fans are configured to draw air cooled by the closed loop coolant circuit.

6. In a re-configurable thermal containment system comprising an enclosure housing a plurality of computing systems, a method comprising:
via a plurality of variable frequency drive (VFD) fans, variably causing circulation of cool air through the plurality of computer systems, which variable circulation is based on heat generated in the plurality of computer systems;
isolating heated air exhausted from the plurality of computer systems;
variably causing circulation of the isolated heated air exhausted from the plurality of computer systems through a closed loop cooling unit;
via a plurality of variable frequency drive (VFD) pumps, variably causing circulation of a heat absorbing fluid through the closed loop cooling unit;
re-circulating the cooled air through the plurality of computer systems; and
via a data center infrastructure management system (DCIM), controlling the VFD fans and pumps for optimal thermal containment based on air temperature, humidity, water flow, water temperature, infrastructure, environmental, and component parameters received by the DCIM from a plurality of connected sensors.

7. The method of claim 6 further comprising selectively receiving a portion of the heat absorbing fluid by a chiller disposed downstream of the closed loop cooling unit.

8. The method of claim 6 further comprising thermal communication with the heat absorbing fluid via a plurality of heat sinks comprised in a corresponding plurality of processors in the computing systems.

9. The method of claim 6, further comprising:
transferring heat from the heat absorbing fluid absorbed from the plurality of computer systems via a first heat exchanger, to a second heat absorbing fluid which passes through a second heat exchanger, wherein the first heat exchanger and the second heat exchanger define a dual loop indirect heat exchanger.

10. The method of claim 6 further comprising:
via a vertical enclosure operatively connected to the closed loop coolant circuit, wherein the vertical enclosure is a chimney comprising the plurality of variable frequency drive fans, drawing air cooled by the closed loop coolant circuit.

* * * * *